(12) United States Patent
Ham

(10) Patent No.: US 7,230,253 B2
(45) Date of Patent: Jun. 12, 2007

(54) CARRIER AND ANALYZING APPARATUS INCLUDING THE CARRIER

(75) Inventor: Yong-nam Ham, Gyeonggi-do (KR)

(73) Assignee: Samsung SDI Co., Ltd., Suwon-si (KR)

(*) Notice: Subject to any disclaimer, the term of this patent is extended or adjusted under 35 U.S.C. 154(b) by 247 days.

(21) Appl. No.: 10/910,327

(22) Filed: Aug. 4, 2004

(65) Prior Publication Data

US 2005/0035303 A1   Feb. 17, 2005

(30) Foreign Application Priority Data

Aug. 12, 2003   (KR) .................... 10-2003-0055886

(51) Int. Cl.
 *H01J 37/20* (2006.01)
(52) U.S. Cl. ................................. 250/442.11
(58) Field of Classification Search ........... 250/442.11, 250/441.11, 310
 See application file for complete search history.

(56) References Cited

U.S. PATENT DOCUMENTS 7,060,990 B2 *   6/2006   Tanaka et al. ......... 250/442.11

FOREIGN PATENT DOCUMENTS

| JP | 62-51265 | 3/1987 |
|---|---|---|
| JP | 63-228558 | 9/1988 |
| JP | 2000-162166 | 6/2000 |
| JP | 2002-328105 | 11/2002 |

OTHER PUBLICATIONS

Office Action issued in Japanese Patent Application No. 2004-211737 on May 9, 2006.

* cited by examiner

*Primary Examiner*—Kiet T. Nguyen
(74) *Attorney, Agent, or Firm*—Stein, McEwen & Bui, LLP

(57) ABSTRACT

A carrier, and an analyzing apparatus including the carrier, the carrier including a sample holder having a guide groove, a sample receiver on which to mount the sample holder, the sample receiver having a guide rail to couple with the guide groove, and a sample elevator to elevate the sample receiver up and down, to receive and discharge the sample holder, wherein the sample elevator includes a driving portion to drive the sample receiver up and down, and a vacuum chamber to maintain a vacuum in an enclosed state around the sample holder.

16 Claims, 7 Drawing Sheets

CARRIER AND ANALYZING APPARATUS INCLUDING THE CARRIER

CROSS-REFERENCE TO RELATED APPLICATIONS

This application claims the benefit of Korean Patent Application No. 2003-55886, filed on Aug. 12, 2003, in the Korean Intellectual Property Office, the disclosure of which is incorporated herein by reference.

BACKGROUND OF THE INVENTION

1. Field of the Invention

The present invention relates to a carrier capable of shielding a sample from moisture, and an analyzing apparatus including the carrier.

2. Description of the Related Art

FIG. 1 is a perspective view of a conventional carrier used in X-ray photoelectron spectroscopy. In FIG. 1, reference numeral 1 denotes a sample holder mounting portion, reference numeral 2 denotes an entrance, reference numeral 3 denotes a locking portion, and reference numeral 4 denotes a flange. When a sample holder (not shown) is mounted on the sample holder mounting portion 1 and a handle 5 is then turned, the sample holder mounting portion 1 moves up to be located within a chamber 6.

However, while the sample holder is being mounted on the sample holder mounting portion 1, it may collide with the entrance 2, and, accordingly, a sample may be damaged. Also, while the locking portion 3 is being installed in an analyzing apparatus, a fixing device of the locking portion 3 may collide with the analyzing apparatus, and accordingly, the locking porting 3 may be damaged. Further, since the flange 4 is welded, if it is vacuum-destroyed by an impact, repair of the carrier is difficult. A conventional carrier used in a conventional analyzing apparatus does not have a moisture shielding function. Hence, to maintain a vacuum in a sample and shield moisture, air is blocked using an air curtain, or an analyzing apparatus is installed within a dry room or a dry box.

FIG. 2 is a scanning electron microscopy (SEM) picture which shows a result of analysis on a solid electrolyte interface (SEI) film on an Li surface made by an analyzing apparatus in which a conventional carrier is installed. Referring to FIG. 2, a shape of the SEI film was severely deformed due to a contact with air. Particularly, electrolyte particles in the circles indicated by arrows were cracked due to a contact with air.

A conventional analyzing apparatus must prevent moisture from being introduced into all of the equipment of the analyzing apparatus, thus greatly increasing maintenance costs. A conventional carrier for carrying a sample does not have a moisture shielding function, thus increasing a probability that the sample will have a contact with air.

SUMMARY OF THE INVENTION

The present invention provides a carrier capable of shielding a sample from moisture, and an analyzing apparatus including the carrier.

Additional aspects and/or advantages of the invention will be set forth in part in the description which follows and, in part, will be obvious from the description, or may be learned by practice of the invention.

According to an aspect of the present invention, there is provided a carrier comprising a sample holder having a guide groove, a sample receiver on which to mount the sample holder, the sample receiver having a guide rail to couple with the guide groove, and a sample elevator to elevate the sample receiver up and down, to receive and discharge the sample holder, wherein the sample elevator comprises a driving portion to drive the sample receiver up and down, and a vacuum chamber to maintain a vacuum in an enclosed state around the sample holder.

According to another aspect of the present invention, there is provided an analyzing apparatus comprising an analyzing chamber, a sample mounting portion to move a sample into the analyzing chamber, an illuminating portion to radiate an electron beam to the sample, and a detection portion to detect electrons from the sample to analyze a surface of the sample. The sample mounting portion comprises a carrier comprising a sample holder having a guide groove, a sample receiver on which to mount the sample holder, the sample receiver having a guide rail to couple with the guide groove, and a sample elevator to elevate the sample receiver up and down to receive and discharge the sample holder, wherein the sample elevator comprises a driving portion to drive the sample receiver up and down, and a vacuum chamber to maintain a vacuum in an enclosed state; a loading chamber detachably coupled to the analyzing chamber and the carrier, to load the sample holder into the analyzing chamber; and a guide bar to move the sample holder into the loading chamber.

The sample receiver may include a fixing pin to prevent movement of the sample holder.

The fixing pin may protrude upward from a bottom surface of the sample receiver.

The guide rail may protrude from both side surfaces of the sample receiver toward an inner area of the sample receiver.

The guide rail may be formed of at least one rib.

The sample holder may comprise a restacker in which the guide groove is formed, and a clamper coupled to an upper part of the restacker.

The driving portion may comprise a screw to move the sample receiver up and down, a rotating shaft to rotate the screw, and a handle coupled to the rotating shaft, to apply a rotating force to the rotating shaft.

The sample elevator may further comprise a locking portion to couple to an external apparatus.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
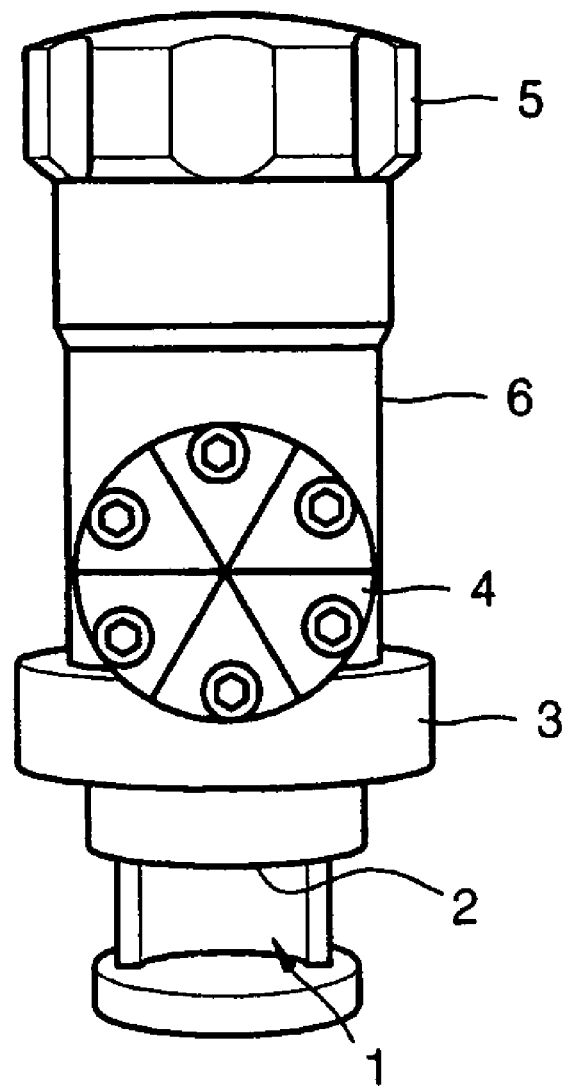
FIG. 1 is a perspective view of a conventional carrier.

Reference will now be made in detail to the embodiments of the present invention, examples of which are illustrated in the accompanying drawings, wherein like reference numerals refer to the like elements throughout. The embodiments are described below to explain the present invention by referring to the figures.

Figure 3A:
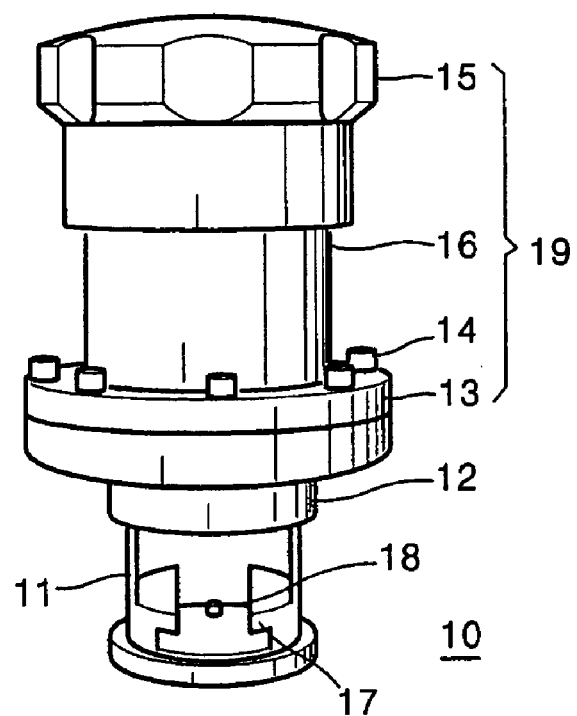
FIG. 3A is a perspective view of a carrier according to an embodiment of the present invention excluding a sample holder.
Figure 3B:
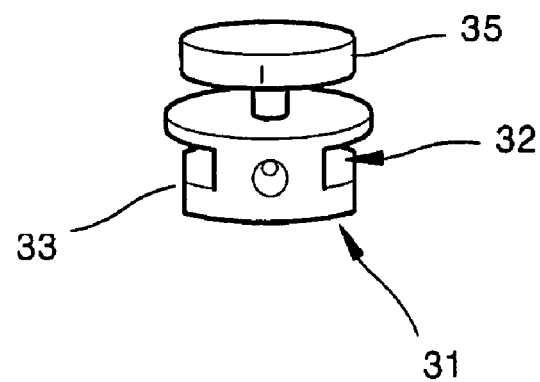
FIG. 3B is a perspective view of a sample holder to be included in the carrier of FIG. 3A.

FIG. 3A is a perspective view of a carrier 10 according to an embodiment of the present invention, and FIG. 3B is a perspective view of a sample holder 31 which is included in the carrier 10.

Referring to FIG. 3B, the sample holder 31 holds a sample and includes a restacker 33, in which a guide receiving member, illustrated in this embodiment by the guide groove 32, is formed, and a clamper 35 which is coupled to an upper part of the restacker 33. The sample is pre-treated prior to being placed in the sample holder 31. Because a metal such as Li is sensitive to moisture, it is stored in, for example, a desiccator, which contains a moisture absorption agent. The sample holder 31 is moved into a dry room 24 hours before the pretreatment of the sample. A carbon tape is attached to the sample holder 31, and then a sample of an appropriate size is attached to the carbon tape. Thereafter, the attached sample is covered with a small amount of silver paste and coated with a metal such as Au, Au—Pd, Pd, Pt, and the like. When the sample holder 31 is prepared, it is mounted on the carrier 10 of FIG. 3A.

Referring to FIG. 3A, the carrier 10 includes a sample receiver 11 and a sample elevator 19. The sample receiver 11 receives the sample holder 31, and has a guide member, illustrated in this embodiment by the guide rail 17, which is interlocked with the guide groove 32 of the sample holder 31. The sample elevator 19 elevates the sample receiver 11, and receives or discharges the sample holder 31. The sample elevator 19 includes a driving portion (see FIG. 5), which drives the sample receiver 11 up and down, and a vacuum chamber 16, which includes the driving portion and maintains a vacuum in an enclosed state.

The sample receiver 11 has a space in which the sample holder 31 is mounted. The guide rail 17 guides a movement of the sample holder 31 by interlocking with the guide groove 32 of the sample holder 31, and protrudes from left and right walls of the sample receiver 11 toward the inside of the sample receiver 11. The guide rail 17 may be a plate as shown in FIG. 3A, or formed of a plurality of ribs. The guide rail 17 may have various shapes, as long as it can be interlocked with the guide groove 32.

A fixing member, illustrated in this embodiment by the fixing pin 18, protrudes upward from a bottom surface of the sample receiver 11 and prevents the sample holder 31 from being separated from the sample receiver 11. Left and right protrusions of the guide rail 17 are in the shape of plates but may be formed of a plurality of ribs to guide the sample holder 31. An entrance 12 coupled to the sample elevator 19 is located above the sample receiver 11.

The sample elevator 19 includes the vacuum chamber 16, which creates a vacuum for the sample, the driving portion (see FIG. 5), which is located within the vacuum chamber 16 and drives the sample receiver 11 up and down, and a locking portion 13, which locks the carrier 10 to an analyzing apparatus. The handle 15 is a part of the driving portion (see FIG. 5), which will be described later with reference to FIG. 5.

Figure 4:
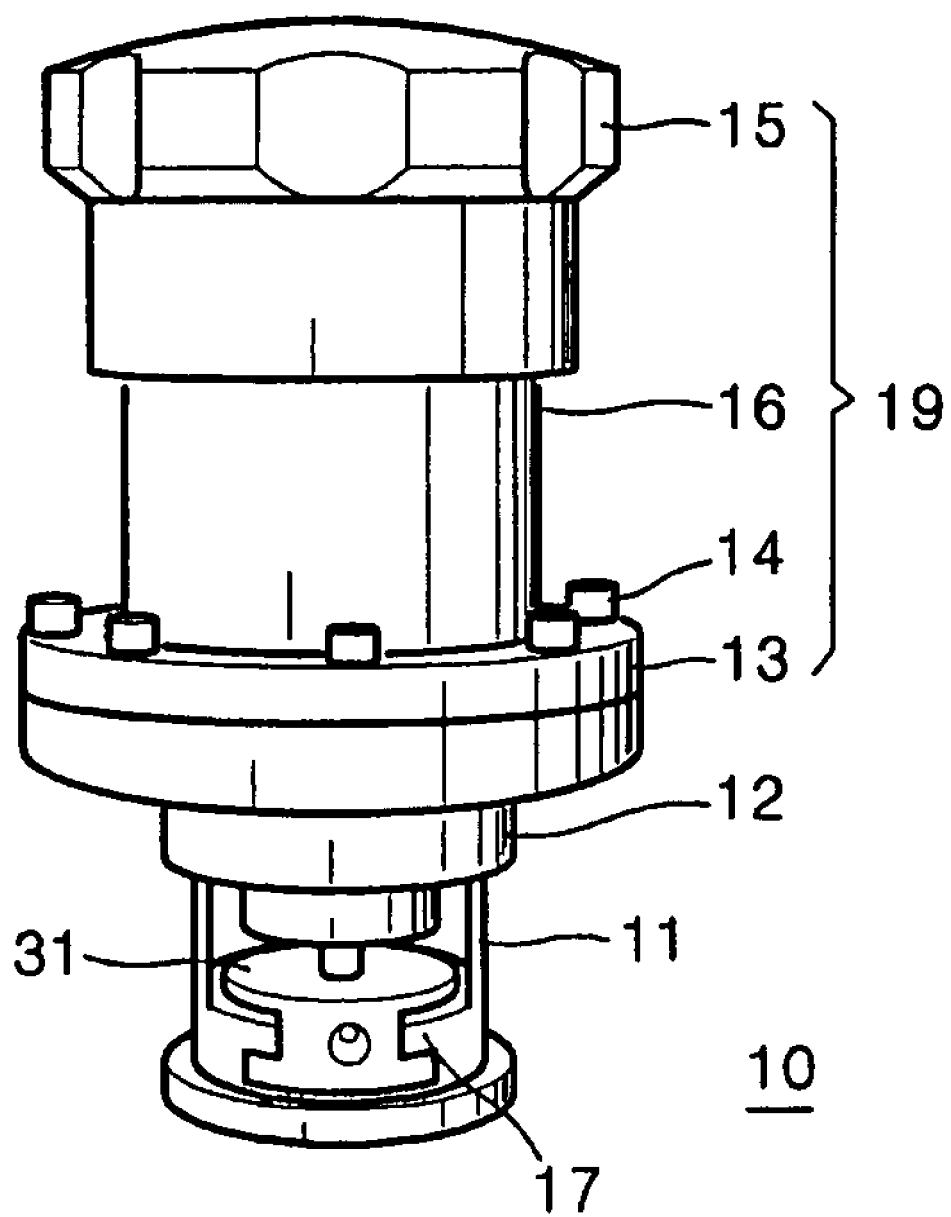
FIG. 4 is a perspective view of a carrier according to the embodiment of the present invention shown in FIG. 3A with the sample holder of FIG. 3B.

FIG. 4 is a perspective view of the carrier 10 in which the sample holder 31 of FIG. 3B is mounted on the sample receiver 11 of FIG. 3A. Referring to FIG. 4, the guide groove 32 of the sample holder 31 is interlocked with the guide rail 17 of the sample receiver 11 so that the sample holder 31 is seated on the sample receiver 11. The fixing pin 18 of the sample receiver 11 prevents the sample holder 31 from being separated from the sample receiver 11. When the sample holder 31 is mounted on the sample receiver 11, the handle 15 of the sample elevator 19 is turned to insert the sample receiver 11 into the sample elevator 19.

Figure 5:
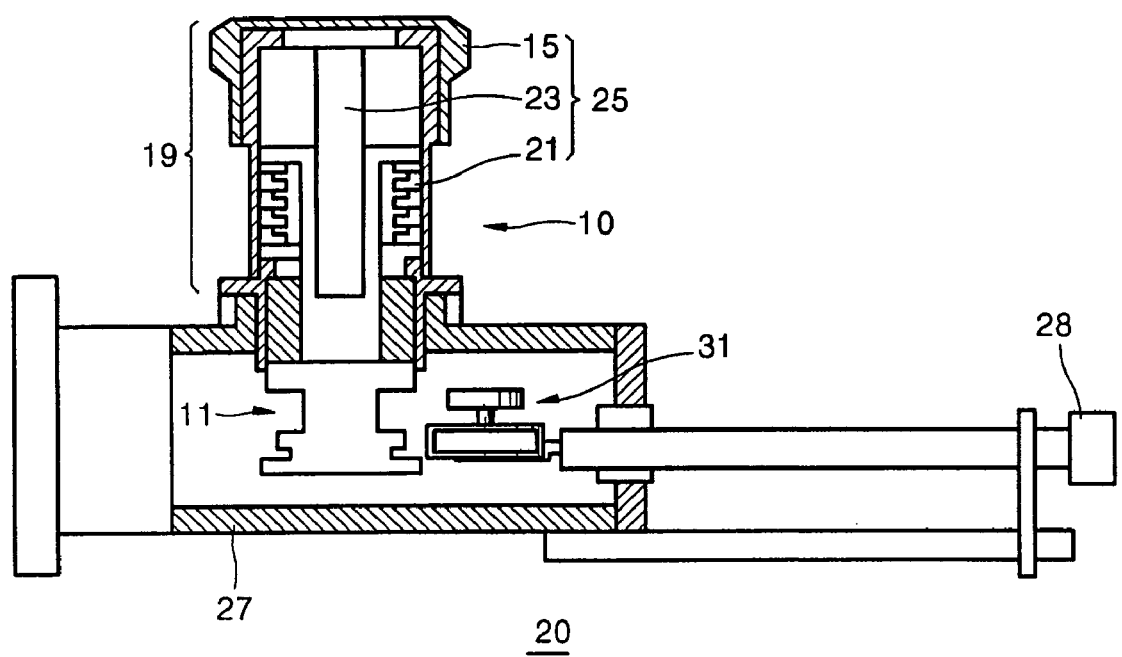
FIG. 5 is a cross-sectional view of a carrier structure according to an embodiment of the present invention.

FIG. 5 is a cross-sectional view of the carrier 10 seated on a loading chamber 27. Referring to FIG. 5, a sample introduction portion 20 includes the loading chamber 27, the carrier 10, and a guide bar 28. The guide bar 28 clamps the sample holder 31 of the carrier 10 and moves the sample holder 31 to the sample receiver 11. FIG. 5 shows a driving portion 25 in the sample elevator 19 of the carrier 10. The driving portion 25 includes a screw 21, which moves the sample receiver 11 up and down, a rotating shaft 23, which rotates the screw 21, and the handle 15, which is connected to the rotating shaft 23 and applies a rotating force to the rotating shaft 23. As the handle 15 rotates, the rotating shaft 23 is rotated, and at the same time, the screw 21 is driven to move the sample receiver 11 up and down.

Figure 6:
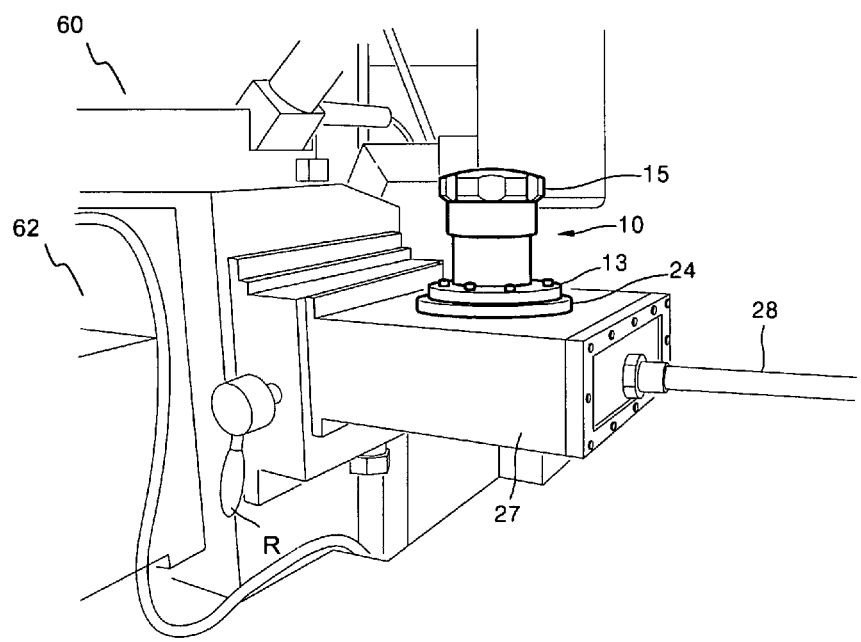
FIG. 6 is a partial perspective view of an analyzing apparatus according to an embodiment of the present invention.

FIG. 6 is a partial perspective view of an analyzing apparatus 60 according to an embodiment of the present invention, in which the carrier 10 is installed. A process of coupling the carrier 10 to the loading chamber 27, and moving the sample holder 31 into an analyzing chamber 62 of the analyzing apparatus 60 will now be described with reference to FIGS. 3A, 5, and 6.

First, a connecting portion 24 of the loading chamber 27, which will be interlocked with a locking portion 13 of the carrier 10, is covered with a lid to make a vacuum in an analyzing chamber 62 of the analyzing apparatus 60 including the loading chamber 27. The carrier 10, in which the sample holder 31 is loaded on the sample receiver 11, is brought to the analyzing apparatus 60.

A vacuum of the loading chamber 27 is released, and then the carrier 10 is coupled to the loading chamber 27 via the connecting portion 24. Thereafter, the loading chamber 27 is returned to a vacuum state. Next, the loading chamber 27 is completely fixed to the chamber 62 of the analyzing apparatus 60 by turning a fixing ring R. When the loading chamber 27 completely enters into a vacuum state, the handle 15 of the carrier 10 is turned to insert the sample receiver 11 into the loading chamber 27.

The guide bar 28 is pushed into the loading chamber 27, clamps the sample holder 31, and moves the sample holder 31 toward the analyzing chamber 62 of the analyzing apparatus 60. Before the sample receiver 11 is removed from the vacuum chamber 16 of the carrier 10, the fixing ring R is turned to open a door between the loading chamber 27 and the analyzing chamber 62 of the analyzing apparatus 60. Then, the guide bar 28 is pushed into the loading chamber 27 and moves the sample holder 31 to a center portion of the analyzing chamber 62 of the analyzing apparatus 60. The sample holder 31 is located at the center portion of the analyzing chamber 62 of the analyzing apparatus 60, and then the guide bar 28 is moved out of the analyzing chamber 62. The fixing ring R is turned to close the door of the analyzing chamber 62 of the analyzing apparatus 60 and separate the analyzing chamber 62 from the loading chamber 27. Thereafter, the analyzing 60 apparatus is driven to analyze the sample. Removal of the sample holder 31 from the chamber 62 of the analyzing apparatus 60, and a separation of the carrier 10 from the analyzing apparatus 60, can be achieved by performing the above-described process in opposition.

Figure 2:
FIG. 2 is a scanning electron microscopy (SEM) picture which shows a result of an analysis on a solid electrolyte interface (SEI) film on an Li surface made by a conventional analyzing apparatus.
Figure 7:
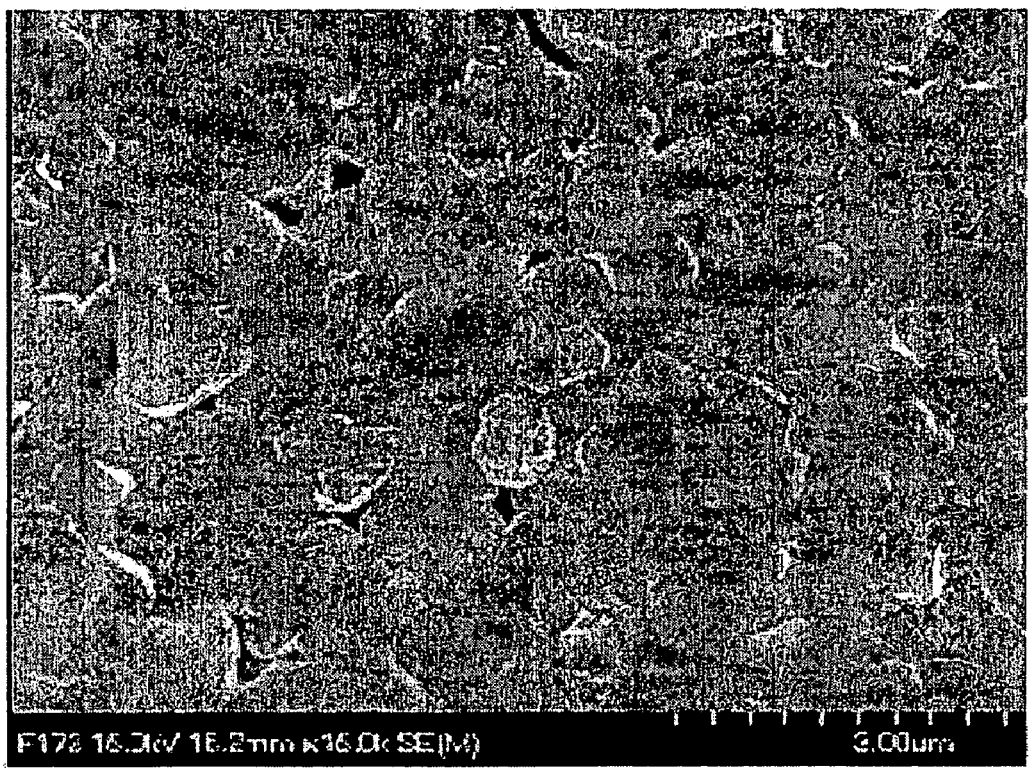
FIG. 7 is an SEM picture which shows a result of an analysis on an SEI film on a Li surface made by an analyzing apparatus in which the carrier of FIG. 4 is installed.

FIG. 7 is an SEM picture which shows a result of an analysis on an SEI film on an Li surface made by an analyzing apparatus in which the carrier of FIG. 4 is installed. Particles of an SEI film on an Li surface in FIG. 7 are more uniform than that in FIG. 2, and were not cracked. Particularly, in the field of Li metal batteries, the analyzing apparatus including the moisture shielding carrier according to an embodiment of the present invention can prevent an SEI film, which is an important factor for performance improvement, from being damaged by moisture upon analysis. Also, the analyzing apparatus according to an embodiment of the present invention can precisely analyze a charged positive pole and a charged negative pole that are sensitive to a humid atmosphere, thereby accurately predicting the durability of an Li battery. Furthermore, the analyzing apparatus according to an embodiment of the present invention can be maintained in a high vacuum state by shielding humidity when various types of samples are analyzed, thereby achieving a precise analysis.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A carrier comprising:
    a sample holder having a guide groove;
    a sample receiver on which to mount the sample holder, the sample receiver having a guide rail to couple with the guide groove; and
    a sample elevator to elevate the sample receiver up and down, to receive and discharge the sample holder,
    wherein the sample elevator comprises:
        a driving portion to drive the sample receiver up and down, and
        a vacuum chamber to maintain a vacuum in an enclosed state around the sample holder.

2. The carrier of claim 1, wherein the sample receiver comprises a fixing pin to prevent movement of the sample holder inside the sample receiver, and wherein the sample elevator further comprises a locking portion to be coupled to an external apparatus.

3. The carrier of claim 2, wherein the fixing pin protrudes upward from a bottom surface of the sample receiver.

4. The carrier of claim 1, wherein the guide rail protrudes from both side surfaces of the sample receiver toward an inner area of the sample receiver.

5. The carrier of claim 1, wherein the guide rail is formed as at least one rib.

6. The carrier of claim 1, wherein the sample holder comprises:
    a restacker in which the guide groove is formed; and
    a clamper coupled to an upper part of the restacker.

7. The carrier of claim 1, wherein the driving portion comprises:
    a screw to move the sample receiver up and down;
    a rotating shaft to rotate the screw; and
    a handle coupled to the rotating shaft, to apply a rotating force to the rotating shaft.

8. The carrier of claim 1, wherein the carrier is mounted on a sample mounting portion of an analyzing apparatus for moving a sample disposed on the sample holder into an analyzing chamber,
    wherein the sample mounting portion further comprises a loading chamber, detachably coupled to the analyzing chamber and the carrier, to load the sample holder into the loading chamber, and
    a guide bar to move the sample holder in the loading chamber toward the analyzing chamber.

9. A carrier comprising:
    a sample holder having a guide groove;
    a sample receiver on which the sample holder is mounted thereon, the sample receiver having a guide rail, which, when the sample holder is mounted, interlocks with the guide groove to secure the sample holder; and
    a sample elevator arranged to rotate the sample receiver up and down so as to receive the same holder or to discharge the sample holder,
    wherein the sample elevator comprises a driving portion to rotate the sample receiver up and down, and a vacuum chamber to maintain the sample holder in a vacuum.

10. The carrier of claim 9, wherein the sample receiver further comprises a fixing pin arranged to prevent movement of the sample holder inside the sample receiver.

11. The carrier of claim 10, wherein the fixing pin protrudes upward from a bottom surface of the sample receiver to prevent the sample holder from being separated from the sample receiver.

12. The carrier of claim 9, wherein the guide rail protrudes from both side surfaces of the sample receiver toward an inner area of the sample receiver.

13. The carrier of claim 9, wherein the guide rail is formed of a plurality of ribs.

14. The carrier of claim 9, wherein the sample holder further comprises:
    a restacker in which the guide groove is formed; and
    a clamper coupled to an upper part of the restacker.

15. The carrier of claim 9, wherein the driving portion comprises:
    a screw to move the sample receiver up and down;
    a rotating shaft to rotate the screw; and
    a handle coupled to the rotating shaft to apply a rotating force to the rotating shaft.

16. The carrier of claim 9, wherein the sample elevator further comprises a locking portion to be coupled to an external apparatus.

* * * * *